United States Patent [19]

Radencic

[11] 4,179,990
[45] Dec. 25, 1979

[54] METHOD FOR MAKING LITHOGRAPHIC PRINTING PLATES

[76] Inventor: Frank J. Radencic, 7932 Haskell, Kansas City, Kans. 66109

[21] Appl. No.: 758,011

[22] Filed: Jan. 10, 1977

Related U.S. Application Data

[62] Division of Ser. No. 631,038, Nov. 12, 1975, abandoned.

[51] Int. Cl.² .................. B41C 1/10; B41C 1/12; G03F 3/04
[52] U.S. Cl. .................. 101/467; 33/184.5; 101/DIG. 12; 101/211; 430/22
[58] Field of Search .............. 33/184.5; 101/DIG. 12, 101/211, 467; 96/30, 31, 41, 27

[56] References Cited

U.S. PATENT DOCUMENTS

| | | | |
|---|---|---|---|
| 1,151,460 | 8/1915 | Hatt | 96/30 |
| 1,761,863 | 6/1930 | Bassist | 33/184.5 |
| 1,860,361 | 5/1932 | Huebner | 33/184.5 |
| 1,896,739 | 2/1933 | Breslauer | 33/184.5 |
| 2,385,599 | 9/1945 | Ball | 96/30 |
| 2,417,496 | 3/1947 | Huebner | 101/DIG. 12 |
| 2,688,194 | 9/1954 | Jordan | 33/184.5 |
| 2,894,454 | 7/1959 | Hillier | 101/211 |
| 2,921,378 | 1/1960 | Mueller | 33/184.5 |
| 3,123,000 | 3/1964 | Saunders | 33/184.5 |
| 3,326,682 | 6/1967 | Wiesbaden et al. | 96/30 |
| 3,695,760 | 10/1972 | Orr | 33/184.5 |
| 4,003,745 | 1/1977 | Blanks | 96/30 |

FOREIGN PATENT DOCUMENTS 476846  9/1915  France ..................... 33/184.5

Primary Examiner—Clyde I. Coughenour
Attorney, Agent, or Firm—Schmidt, Johnson, Hovey & Williams

[57] ABSTRACT

A tool for effecting precision layout is provided with a translucent support surface and means for accurately positioning a straight edge in any of a number of preselected positions spanning the support surface. Apertures through opposite ends of the straight-edge element are selectively alignable with spaced rows of precision indexing holes which circumscribe the support surface. A pair of locator pins are removably disposed within said apertures projecting into selected indexing holes to accurately locate and retain the straight-edge element in a desired position across the support surface. A related registering method is provided which utilizes accurately positioned, perpendicularly intersecting lines to locate image transparencies upon a masking sheet as well as to register superimposed color impressions during printing.

2 Claims, 9 Drawing Figures

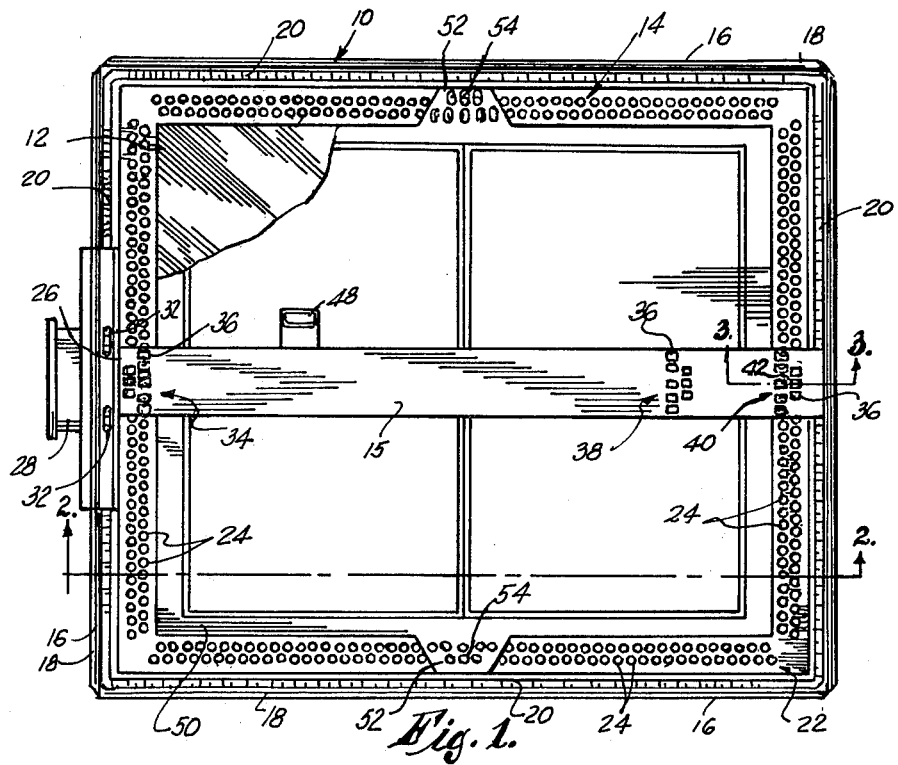
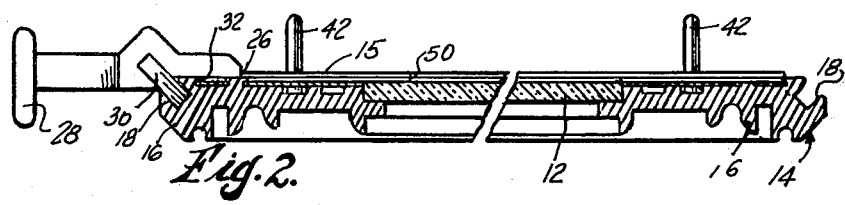
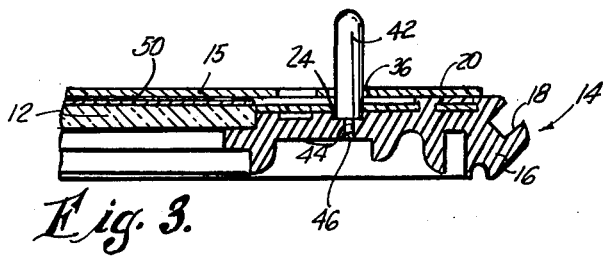

METHOD FOR MAKING LITHOGRAPHIC PRINTING PLATES

This is a division of application Ser. No. 631,038 filed on Nov. 12, 1975 now abandoned.

This invention relates to graphic art devices and particularly concerns a method and apparatus for accurately positioning transparencies upon a masking sheet and registering over-printed impressions in the lithographic reproducing process.

Devices for accurately placing transparencies over a photosensitive plate are well-known in the art as shown, for example, in U.S. Pat. No. 3,621,582, issued Nov. 23, 1971, and entitled "Lithographic Apparatus", and U.S. Pat. No. 2,983,049, issued May 9, 1961, and entitled "Sheet Positioning Method And Apparatus". These prior art patents relate to the so-called "step and repeat" method of positioning the same image on a lithographic plate at a number of different locations.

In the printing industry it is oftentimes desirable in the interest of efficiency to produce a printing plate having a number of different images carried thereupon. When making a multi-image plate, it is extremely important that the images be accurately located relative to one another particularly when multicolor printing is involved, necessitating the production of several single color plates for making overprinted impressions.

It is presently the practice when preparing multi-image plates to first circumscribe the available printing area on a transparency carrier or masking sheet and then lay out the desired location for each of the images to be placed on the plate. The image location is usually designated by a rectangular box drawn on the carrier which is then aligned with register marks on the transparency of the image, which marks correspond to the four corners of the rectangular box. The layout and register operations are generally performed on a light table having a straight edge which is movable relative to the table.

One problem with the above described practice is the fact that there has heretofore been no adequate structure for precisely carrying a straight-edge element on the light table such that the element can repeatedly produce parallel lines with a sufficient degree of reliability. Consequently, successive layouts vary from one another causing problems in the printing process when it is attempted to superimpose impressions printed from plates made by these layouts.

Additionally, the rectangular block and corner register method often results in undesirable distribution of layout errors. In this connection, any errors between the size of the layout block and the location of the register marks are not uniformly distributed but rather are compensated at the whim of the layout operator. For example, the operator may align the left-hand register marks on one layout and align the right-hand register marks on a subsequent layout, thereby compounding the registration error. This uneven distribution of registration error is also present when several one-color images are overprinted to produce a full cover impression. Accordingly, it is an important object of my invention to reduce registration problems in multi-color printing by eliminating uneven distribution of error in the plate-making and printing processes.

In accordance with the above, it is an important object of the instant invention to provide a means for placing layout marks on a transparency carrier or the like with an extremely high degree of accuracy.

It is another important object of the present invention to provide a layout surface for supporting masking sheets which may be under-lighted and which is circumscribed by rows of precision indexing holes for accurately positioning and securing a straight edge across the working surface.

It is yet another important object of the instant invention to provide a method for accurately locating transparencies upon a carrier using central locator marks such that positioning errors are evenly and uniformly distributed.

It is another important object of the present invention to provide a method of registering overprinted impressions using centrally disposed register marks such that registration errors are uniformly distributed throughout the impression.

In the drawings:

FIG. 1 is a plan view of a device constructed in accordance with the present invention;

FIG. 2 is a partial, enlarged, cross-sectional view taken along line 2—2 of FIG. 1;

FIG. 3 is a partial, enlarged, cross-sectional view taken along line 3—3 of FIG. 1;

Figure 4:
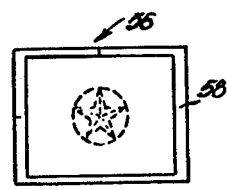
FIG. 4 is a schematic view showing a transparency having an image and register marks carried thereupon.

In FIG. 1 there is shown a layout device 10 comprising a flat, translucent support member 12 carried within a circumscribing frame 14 and an elongate, straight-edge element 15 adapted to be secured to frame 14 across member 12 in a manner as will be described hereinbelow. Though not shown, it is to be understood that device 10 is particularly suited for use with a light source positioned below support member 12 to illuminate the upper surface of member 12, thereby defining a central "light table" working area.

Frame 14 comprises four elongate side rails 16 of complex cross-section, as best shown in FIGS. 2 and 3. Rails 16 are arranged in opposed, parallel pairs intersecting perpendicularly to form a rectangular supporting periphery around member 12. Each rail 16 has an elongate, generally rectangular groove 18 extending the length thereof, opening upwardly and outwardly from member 12.

A scale 20, graduated in inches, is secured along the upper surface of each rail 16 in parallel relationship to groove 18. The values assigned to the inch markings are arranged such that zero corresponds to mid-length of the respective rails 16 with values progressively increasing in either direction as the ends of rail 16 are approached. In this arrangement, lines drawn through respective zero points across member 12 would form a perpendicular intersection at the midpoint of the upper surface on member 12.

Each rail 16 has a row 22 of identical, uniformly spaced, precision indexing holes 24 extending the length of rails 16 adjacent a respective edge of member 12. In the preferred embodiment the holes 24 are arranged in staggered columns having ½ inch center-to-center spacing between adjacent holes with one column offset ¼ inch relative to the other column, thereby providing hole spacing of ¼ inch along the effective length of the rail 16. The rows 22 in each pair of rails 16 are identical such that each hole 24 in one row 22 has a corresponding hole 24 in the opposing row 22 so positioned that a line drawn from center-to-center between the corresponding holes 24 would be exactly perpendicular to the respective rails 16.

The straight-edge element 15 is adapted to rest over member 12 and is of sufficient length to span the distance between opposing rows 22. One end 26 of element 15 is provided with a perpendicularly extending head 28 to present a handle for manipulation of element 15. Head 28 has a downwardly extending rib 30 adapted for sliding engagement within grooves 18 providing a means for preliminarily positioning element 15 in a desired location over member 12. When properly positioned, head 28 partially covers the scale 20 immediately adjacent ends 26, and for this reason, a pair of cutouts 32 are provided in head 28 so that the underlying scale 20 may be easily read.

End 26 is provided with a group 34 of rectangular apertures 36 adapted to overlie one row 22 of holes 24. Each aperture 36 has a width which substantially corresponds to the diameter of holes 24 and a length of somewhat greater dimension. Two additional groups 38 and 40 of apertures 36 are provided near the opposite end of element 15. The spacing between groups 34 and 38 is equal to the spacing between the rows 22 of one opposed pair of rails 16, and the spacing between groups 34 and 40 equals the spacing between rows of the other pair of opposed rails 16. Accordingly, a group of the apertures 36 will overlie each row 22 transversed by the element 15 regardless of which pair of rails 16 is spanned.

A pair of cylindrical locator pins 42 are provided for insertion through apertures 36 projecting into corresponding aligned holes 24 to retain element 15 in a preselected position over member 12. In the preferred embodiment, one of the pins 42 is disposed within an aperture 36 of group 34, while the other pin 42 is disposed within an aperture 36 of either group 38 or 40. As shown in FIG. 3, pin 42 has an axially aligned cylindrical projection 44 which is received within a bore 46 in rail 16. It is to be understood that bores 46 are only present in the holes 24 corresponding to the zero points along each respective rail 16. Accordingly, the locator pin 42 used to position element 15 at any point other than zero location, would not have a projection 44. The diameter of pins 42 is only slightly smaller than the diameter of holes 24 to allow a tight slip fit between pins 42 and the holes 24.

Groups 34, 38 and 40 have substantially identical arrangements of apertures 36, the arrangement in groups 38 and 40 being a mirror image of the arrangement in group 34. The apertures 36 in each group are so positioned that in combination with the underlying holes 24, element 15 may be accurately located in much smaller increments than the ¼ inch spacing between holes 24. Merely providing such an arrangement of apertures is old in the art and is shown in the U.S. Pat. No. 3,621,582 cited above.

A penholder 48 functions to substantially augment the incremental positioning of element 15 by presenting a plurality of accurately spaced holding positions for a marking pen (not shown).

In FIG. 1, a precision registrable masking sheet 50 is shown emplaced between member 12 and element 15. Sheet 50 is of the type typically used in the art, being constructed of translucent material and having a pair of apertured ears 52 adapted to overlie respective rows 22 for receiving pins 54 to secure the sheet in registration with frame 14.

By way of example, the operation of device 10 will be described hereinbelow as used to lay out a transparency carrier such as sheet 50, though it is to be understood that device 10 can be used to perform any of the various layout functions. Sheet 50 is first positioned over member 12 and registered to frame 14 by emplacement of pins 54 in respective holes 24 such that the midpoint of sheet 50 is centrally located on member 12. Element 15 is then placed over sheet 50 spanning one pair of opposed side rails 16 such that rib 30 is in sliding engagement with groove 18. In the position shown in FIG. 1, element 15 is so disposed that groups 34 and 40 overlie respective rows 22 of holes 24. Element 15 is manually moved to a desired location as determined by reading scale 20, and pins 42 are inserted through respective aligned apertures 36 and holes 24 at opposite ends of element 15 to secure the latter at the desired location. At this juncture, it should be noted that the readings from scale 20 are only used to approximately locate element 15; the exact location of element 15 is determined by the particular apertures 36 and holes 24 in which pins 42 are emplaced. The positive pin locating feature eliminates error introduced by inaccurate reading of scale 20.

A marking pen or the like is held against the elongate edge of element 15 as a linear mark is scribed on sheet 50 in the conventional manner. Alternately, the marker may be used in conjunction with penholder 48 to position the linear mark a known distance from one edge of element 15. The positioning and marking process is repeated until the desired number of lines extending between the pair of opposed rails 16 is completed.

Element 15 is then repositioned over sheet 50 to span the second pair of opposed rails 16 such that rib 30 is in engagement with a second groove 18 and groups 34 and 38 overlie respective rows 22 of holes 24. The positioning and marking process is successively repeated as described above until the desired number of lines extending between the second pair of rails 16 is completed.

Member 12 is then under-lighted by a light source (not shown) such that the linear marks on sheet 50 are readily discernible when a transparency or the like is positioned thereover. The desired transparencies are positioned at their respective locations on sheet 50 by registering the layout markings with register marks carried on the transparency whereupon the transparency is secured to the sheet 50 in a conventional manner. Sheet 50 is then removed from device 10 and made available for further operations in the lithographic plate producing process.

It is important to understand that the particular manner in which element 15 is secured to frame 14 at opposite ends renders device 10 extremely well-suited for reliably producing perpendicularly intersecting lines on a transparency carrier or the like. In this connection, since the two opposed pairs of rails 16 intersect one another to form exact 90° angles, lines drawn between respective pairs of rails 16, perpendicular to the latter, will likewise intersect one another to form exact 90° angles. Moreover, precise positioning of lines drawn with straight-edge element 15 is assured because of the accurately located indexing holes 24.

The capability of device 10 to produce accurately positioned, perpendicularly intersecting lines, permits a method of locating transparencies and registering impressions which has heretofore been unavailable in the printing industry. This method comprises the use of centrally located pairs of perpendicularly intersecting lines to designate the desired position of transparency upon a masking sheet and also to provide a registration means for impressions made from the lithographic plates.

Turning now to FIGS. 4 through 9, there is shown several steps in the method of the present invention. In FIG. 4, a transparency 56 is shown having an image and four linear register marks 58 around the periphery thereof. Marks 58 are positioned on the respective horizontal and vertical bisectors of the image carried by transparency 56 such that the extensions of marks 58 would perpendicularly intersect at the midpoint of the image. It is to be understood that, for the purpose of clarity, transparency 56 is shown in reverse; the marks 58 and the image would in actuality be transparent while the remainder of the transparency 56 would be dark.

Transparency 56 is merely a photographic reproduction of an image and register marks contained on a graphic arts medium such as, for example, commercial art board. It is required that the register marks corresponding to marks 58 be accurately emplaced on the art board, and for this reason, the marks may be pre-printed on the board for the artist.

Figure 5:
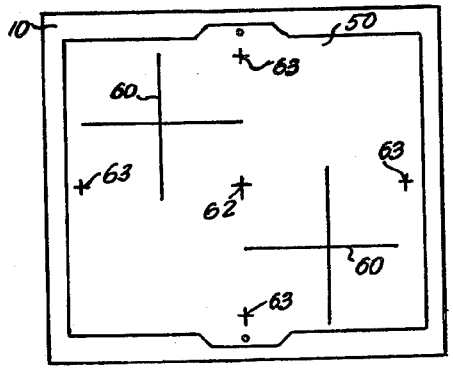
FIG. 5 is a schematic plan view of a masking sheet having layout lines drawn thereupon in accordance with the present invention.
Figure 6:
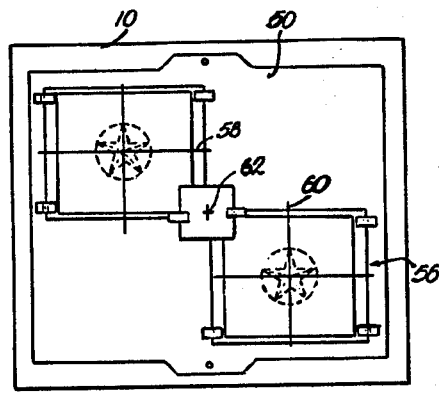
FIG. 6 is a schematic plan view of the masking sheet of FIG. 5 showing transparencies registered and secured thereupon.

In the layout process, a masking sheet 50 is emplaced upon a working frame which could be, for example, the device 10 of the present invention. In the preferred embodiment, sheet 50 would be registered to device 10 in the manner hereinabove described such that the midpoint of sheet 50 is retained in a predetermined location. The available printing area for the particular size printing plate to be produced is calculated and circumscribed upon sheet 50. The desired location of each respective transparency is designated upon the carrier sheet by scribing perpendicularly intersecting lines 60 through the midpoint of the location as shown in FIG. 5. Additionally, another pair of perpendicularly intersecting lines 62 is drawn or printed upon sheet 50, corresponding to the intersection of the horizontal and vertical bisectors of the circumscribed printing area. In the preferred method, additional pairs 63 of perpendicularly intersecting lines may be symmetrically arranged around the periphery of sheet 50 as shown in FIG. 5, wherein one segment of each pair 63 coincides with an extension of lines 62.

Each transparency 56 is then positioned upon sheet 50 by aligning marks 58 with intersecting lines 60, whereupon the transparencies are secured to the sheet 50. It has been found that this aligning procedure can best be performed while sheet 50 is underlighted in a manner permitted by device 10. At this same time, an additional transparency carrying an image of a pair of intersecting line segments is positioned on sheet 50 by superimposing the image over lines 62 and this transparency is also secured to sheet 50. A similar image (not shown) may be registered and secured over each pair 63, the peripheral image being provided to augment the register function of the central image described hereinbelow.

Figure 7:
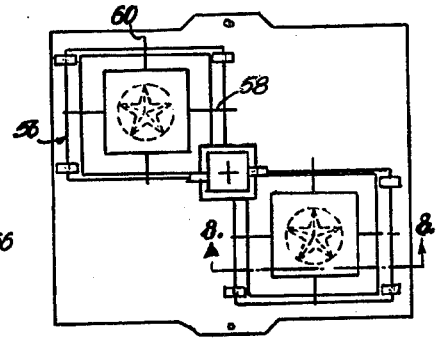
FIG. 7 is a schematic plan view of the masking sheet shown in FIG. 6 with appropriate portions of the masking sheet removed.
Figure 8:
FIG. 8 is a partial, enlarged cross-sectional view taken along line 8—8 of FIG. 7.
Figure 9:
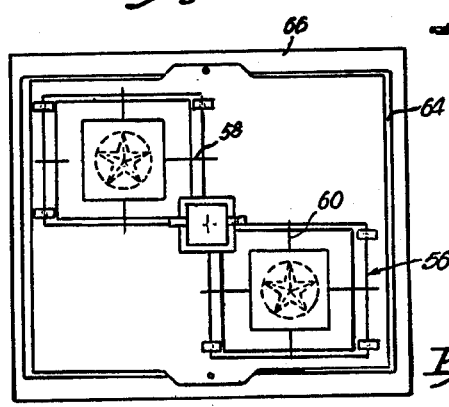
FIG. 9 is a schematic plan view showing the assembly of FIG. 7 positioned over a photosensitive plate.

At this juncture, sheet 50 is removed from device 10 and the portions of sheet 50 underlying the various images are cut away, as shown in FIG. 7 and 8, to form a completed exposure assembly. This exposure assembly is placed over a photosensitive plate 64 which is preferably carried within a precision registrable frame 66 of the type disclosed in U.S. Pat. No. 3,621,582, hereinabove mentioned. It is desirable that frame 66 be coordinated with frame 14 of device 10, so that sheet 50 may be accurately registered to plate 64. That is, frame 66 should have locator holes corresponding to the holes 24 found in device 10.

The exposure assembly, plate 64, and frame 66 are placed in a vacuum frame for exposure of plate 64 to a light source in a manner well known in the art. After exposure, plate 64 carries the various images represented on the transparencies 56, as well as a centrally disposed image of perpendicularly intersecting line segments.

Should it be desired to print multicolor impressions, a number of transparencies 56 must be produced in a conventional manner corresponding to each desired color in the multicolor image. These transparencies would, of course, be obtained by photographically reproducing the original multicolor image successively using various light filters. The above-mentioned plate masking steps would then be repeated for each color transparency 56 until a lithographic plate corresponding to each color in the printing process is produced.

In printing the multicolor impressions, each color lithographic plate is successively overprinted until the full color impression is achieved. In this connection, each subsequent overprint must be accurately registered to the preceding impression.

To begin the printing process, a first impression is made using one of the color lithographic plates, the impression containing images corresponding to those carried by transparencies 56, as well as a centrally disposed perpendicular cross. A second color lithographic plate is then used to overprint a second impression upon the first printed impression, the second impression also having a centrally disposed perpendicular cross. The first and second impressions are registered to one another by superimposing them such that the first and second perpendicular crosses are coincident.

The above described method operates to evenly distribute any errors which may be present in the locating and registering operations of plate production and the printing process. In preparing color multi-image plates it is extremely important that each respective image be located at the same location on each plate in order to permit proper registration of the color impressions during the printing operation. The method of the present invention greatly reduces the degree of image mislocation resulting from conventional locating methods because the present method eliminates compounding of error.

Additionally, the unique method of registering overprinted color impressions disclosed in the present invention is a significant improvement over registering methods previously known in the art. Placing a registration mark at the center of the printing area rather than at the periphery, as is universally the present practice, reduces errors induced in registration caused by changes in size of the paper carrying the impression. Paper change or "stretch" occurring between the time of one color printing and a subsequent second color printing has long plagued the printing industry because of the inherent registration problems presented. in such cases it is common practice for the printer to disregard his normal registration marks in an attempt to register the impressions "by eye". This manual registration of color impressions oftentimes causes even greater problems with registration of subsequent color overprints. To overcome these problems the method of the present invention provides a tool for the printer whereby he can confidently rely upon his registration mark to effect the best possible registration notwithstanding changes in the paper carrying the impressions.

Further, the device of the present invention is capable of producing and accurately positioning true perpendicularly intersecting lines with a degree of repeatability and efficiency heretofore unavailable in the printing art. The precision indexing holes not only assure correct location of the straight-edge element but also permit the straight-edge to be repeatedly positioned in a particular location with a high degree of accuracy. This relocation feature is especially important when it is desired to identically lay out a series of masking sheets such as is required in the making of multi-image color lithographic plates. All of the above-mentioned benefits are provided by the layout device of the present invention without increasing the time required to perform the layout operation.

Having thus described the invention, what is claimed as new and desired to be secured by Letters Patent is:

1. The method of reproducing multi-color images by the lithographic printing process comprising the steps of:
    (a) preparing a desired image upon a graphic arts medium, including the emplacement of linear register marks on said medium, said marks comprising at least two spaced segments of the horizontal bisector of said image and at least two spaced segments of the vertical bisector of said image;
    (b) reproducing said image, and said register marks photographically, successively using a series of preselected light filters to thereby obtain a plurality of transparencies of the image and register marks wherein each transparency corresponds to a respective color in the printing process;
    (c) circumscribing an area of preselected size and configuration on a transparency carrier while the latter is mounted within a precision register layout frame,
    (d) marking a predetermined location for one of said transparencies within said circumscribed area on the carrier by using said frame as a measuring guide to draw single intersecting horizontal and vertical lines through the location midpoint,
    (e) positioning said one transparency upon said carrier while the latter is under-lighted, aligning said register marks with said lines, and subsequently affixing said one transparency to said carrier,
    (f) providing horizontal and vertical linear marks through the midpoint of said circumscribed area using said frame as a measuring guide;
    (g) securing a second transparency, containing an image of two perpendicularly intersecting line segments, to said carrier at the midpoint of said circumscribed area after superimposing said segments over said marks,
    (h) removing the portions of said carrier beneath said transparencies to form a complex exposure assembly;
    (i) overlaying said exposure assembly on a photosensitive metallic plate and exposing the plate to a light source, thereby producing a one-color lithographic plate;
    (j) successively repeating steps (c) through (i) for each transparency until lithographic plates corresponding to each of said transparencies are produced;
    (k) printing a first color impression of the image contained on one of said plates including a first centrally located, perpendicular cross corresponding to said intersecting line segments;
    (l) overprinting a second color impression on said first impression, said second impression being produced by a second of said plates and including a second centrally located perpendicular cross corresponding to said intersecting line segments, said overprinting step including superimposing said impressions such that said crosses coincide with one another; and
    (m) repeating said step (l) for each of the remaining plates, thereby producing a full multicolor reproduction of the original image.

2. The method of claim 1, wherein said plate and said exposure assembly are retained within a second precision register frame, coordinated with said first frame, during said overlaying and exposing steps.

* * * * *